United States Patent
Li (10) Patent No.: US 10,203,547 B2
(45) Date of Patent: Feb. 12, 2019

(54) QUANTUM DOT LIGHT EMITTING DEVICE, BACKLIGHT MODULE, AND LIQUID CRYSTAL DISPLAY DEVICE

(71) Applicant: HISENSE ELECTRIC CO., LTD., Qingdao (CN)

(72) Inventor: Fulin Li, Qingdao (CN)

(73) Assignees: Hisense Electric Co., Ltd., Qingdao (CN); Hisense USA Corporation, Suwanee, GA (US); Hisense International Co., Ltd., Qingdao (CN)

( * ) Notice: Subject to any disclaimer, the term of this patent is extended or adjusted under 35 U.S.C. 154(b) by 0 days.

(21) Appl. No.: 15/351,981

(22) Filed: Nov. 15, 2016

(65) Prior Publication Data

US 2017/0059129 A1 Mar. 2, 2017

(30) Foreign Application Priority Data

Jun. 16, 2016 (CN) .......................... 2016 1 0420354
Jun. 16, 2016 (CN) .......................... 2016 1 0425664

(51) Int. Cl.
*G02F 1/13357* (2006.01)
*H01L 33/50* (2010.01)
*G02F 1/1335* (2006.01)

(52) U.S. Cl.
CPC .......... *G02F 1/1336* (2013.01); *H01L 33/507* (2013.01); *G02F 2001/133614* (2013.01)

(58) Field of Classification Search
CPC ....... G02F 1/1336; G02F 2001/133614; G02B 6/0068; G02B 6/0073
See application file for complete search history.

(56) References Cited

U.S. PATENT DOCUMENTS 9,746,710 B2 * 8/2017 Li ..................... G02F 1/133603
2011/0229995 A1 9/2011 Scianna et al.
(Continued)

FOREIGN PATENT DOCUMENTS

CN 101212015 A 7/2008
CN 101370906 A 2/2009
(Continued)

OTHER PUBLICATIONS

Office Action from corresponding Chinese Application No. 201610420354.0 dated Dec. 4, 2017 (7 pages).
(Continued)

*Primary Examiner* — Dung Nguyen
(74) *Attorney, Agent, or Firm* — Harness, Dickey & Pierce, P.L.C.

(57) ABSTRACT

This disclosures provides a quantum dot light emitting device, a backlight module, and a liquid crystal display device, the quantum dot light emitting device including: a light emitting device configured to generate exciting light at a first wavelength; a first quantum dot package layer configured to absorb the exciting light at the first wavelength, and to generate converted light at a second wavelength; and a second quantum dot package layer configured to absorb the exciting light at the first wavelength, and to generate converted light at a third wavelength; wherein the first quantum dot package layer is located between the light emitting device and the second quantum dot package layer, and the third wavelength is shorter than the second wavelength, and longer than the first wavelength.

16 Claims, 7 Drawing Sheets

(56) References Cited

U.S. PATENT DOCUMENTS

| | | | |
|---|---|---|---|
| 2014/0022779 A1* | 1/2014 | Su | F21V 9/30 |
| | | | 362/231 |
| 2016/0072026 A1 | 3/2016 | Kanaumi | |
| 2017/0168351 A1* | 6/2017 | Qiu | G02B 6/005 |

FOREIGN PATENT DOCUMENTS

| | | |
|---|---|---|
| CN | 101451673 | 6/2009 |
| CN | 102130236 A | 7/2011 |
| CN | 102356480 A | 2/2012 |
| CN | 102403438 A | 4/2012 |
| CN | 103545428 A | 1/2014 |
| CN | 103681991 A | 3/2014 |
| CN | 103915546 A | 7/2014 |
| CN | 104221172 A | 12/2014 |
| CN | 104241506 A | 12/2014 |
| CN | 204102939 U | 1/2015 |
| CN | 104521016 A | 4/2015 |
| CN | 104808386 A | 7/2015 |
| CN | 105093671 A | 11/2015 |
| DE | 102014210492 | 12/2015 |

OTHER PUBLICATIONS

Office Action from Chinese Application No. 201610420354.0 dated Apr. 28, 2018 (4 pages).

Office Action from Chinese Application No. 201610425664.1 dated Aug. 23, 2018 (7 pages).

* cited by examiner

Fig. 1A

PRIOR ART

Fig. 1B

PRIOR ART

Fig. 1C

PRIOR ART

QUANTUM DOT LIGHT EMITTING DEVICE, BACKLIGHT MODULE, AND LIQUID CRYSTAL DISPLAY DEVICE

CROSS-REFERENCE TO RELATED APPLICATION

This application claims the benefit and priority of Chinese Patent Application No. 201610420354.0 filed Jun. 16, 2016 and Chinese Patent Application No. 201610425664.1 filed Jun. 16, 2016. The entire disclosures of the above applications are incorporated herein by reference.

FIELD

This disclosure relates to the field of display technologies, and particularly to a quantum dot light emitting device, a backlight module, and a liquid crystal display device.

BACKGROUND

This section provides background information related to the present disclosure which is not necessarily prior art.

A liquid crystal display device includes a liquid crystal panel, a mechanical frame, optical components, some circuit boards, etc. Since liquid crystals do not emit light, some backlight sources need to be configured, so that a picture can be displayed, where a backlight module is configured to provide the liquid crystal display device with backlight sources with uniform brightness, so that the liquid crystal display device can display the picture normally.

With the quantum dot technologies, backlight sources with a high color gamut in National Television System Committee (NTSC) standard at 100% or above can be realized. Quantum dots are also referred to as semiconductor nanometer crystals, only 10 nm or less in size, and can emit stronger light than that emitted by fluorophores in a narrow wavelength range due to quantum confinement effect. Moreover given the same material, quantum dots with different sizes can emit light at different wavelengths, and the light wavelength decreases as the quantum dot size decreases, so that light at a desirable wavelength can be produced by adjusting the quantum dot size.

SUMMARY

This section provides a general summary of the disclosure, and is not a comprehensive disclosure of its full scope or all of its features.

This disclosure provides a quantum dot light emitting device, a backlight module, and a liquid crystal display device so as to improve the light conversion efficiency of quantum dot materials.

In an aspect, this disclosure provides a quantum dot light emitting device including: a light emitting device configured to generate exciting light at a first wavelength; a first quantum dot package layer configured to absorb the exciting light at the first wavelength, and to generate converted light at a second wavelength; and a second quantum dot package layer configured to absorb the exciting light at the first wavelength, and to generate converted light at a third wavelength; wherein the first quantum dot package layer is located between the light emitting device and the second quantum dot package layer, and the third wavelength is shorter than the second wavelength, and longer than the first wavelength.

In another aspect, this disclosure further provides a backlight module including the quantum dot light emitting device above.

In still another aspect, this disclosure further provides a liquid crystal display device including the backlight module above, and a liquid crystal display panel arranged above the backlight module.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

Figure 1A:
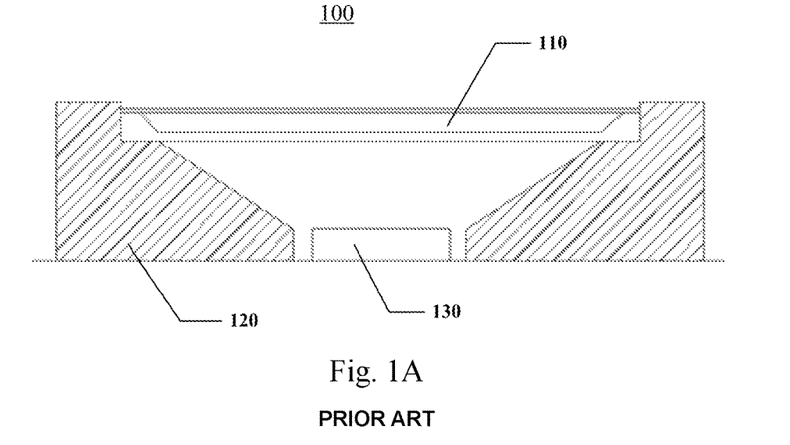
FIG. 1A is a schematic structural diagram of a quantum dot light emitting light source in the relevant art.

In the relevant art, blue exciting light (also referred to as absorption light) is emitted by a blue Light Emitting Diode (LED) chip to excite a quantum dot material to generate white light. FIG. 1A is a schematic structural diagram of a quantum dot light emitting light source in one relevant art, and as illustrated in FIG. 1A, the quantum dot light emitting light source 100 includes a blue LED chip 130 arranged on a Printed Circuit Board (PCB), and a package substrate 120 affixed on the PCB and formed in groove structure, where the LED chip 130 is located at the center of the bottom of the groove, and a quantum dot layer 110 is arranged on the top ends of the package substrate 120. In order to prevent a quantum dot material from failing at high temperature (above 70° C.), a thermal insulation layer is arranged between the quantum dot layer 110 and the blue LED chip; e.g., the thermal insulation layer can be a layer of a thermal insulation material, or an air layer to reserve some distance between the quantum dot layer 110 and the blue LED chip.

Figure 1B:
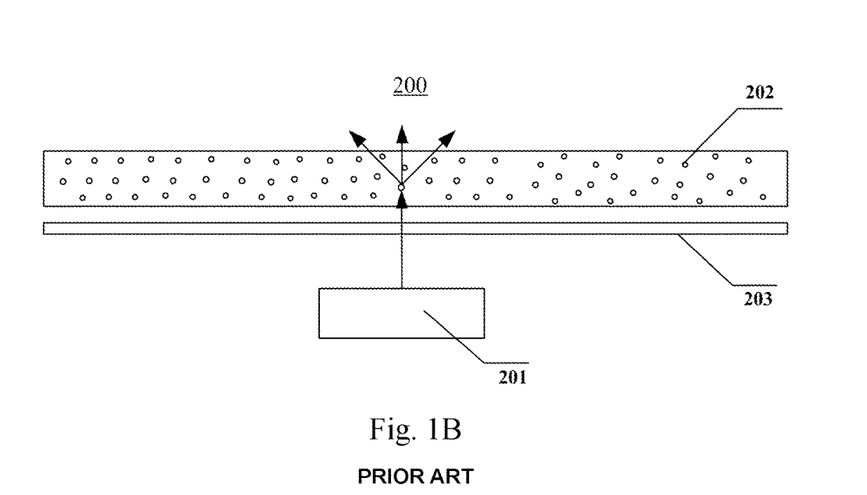
FIG. 1B is a schematic structural diagram of another quantum dot light emitting light source in the relevant art.

FIG. 1B is a schematic structural diagram of another quantum dot light emitting light source in relevant art, and as illustrated in FIG. 1B, the quantum dot light emitting light source 200 includes: a blue LED chip 201 arranged on a circuit board; a light guide component 203 which can include one or more of a light guide plate, a diffuser, an optical film, etc.; and a quantum dot package layer 202 with a water and oxygen barrier layer (not illustrated) applied on the outer surface thereof, where the water and oxygen barrier layer is used to isolate the quantum dots from the water and oxygen, and thus avoid the quantum dots from being oxidized and changed.

Figure 1C:
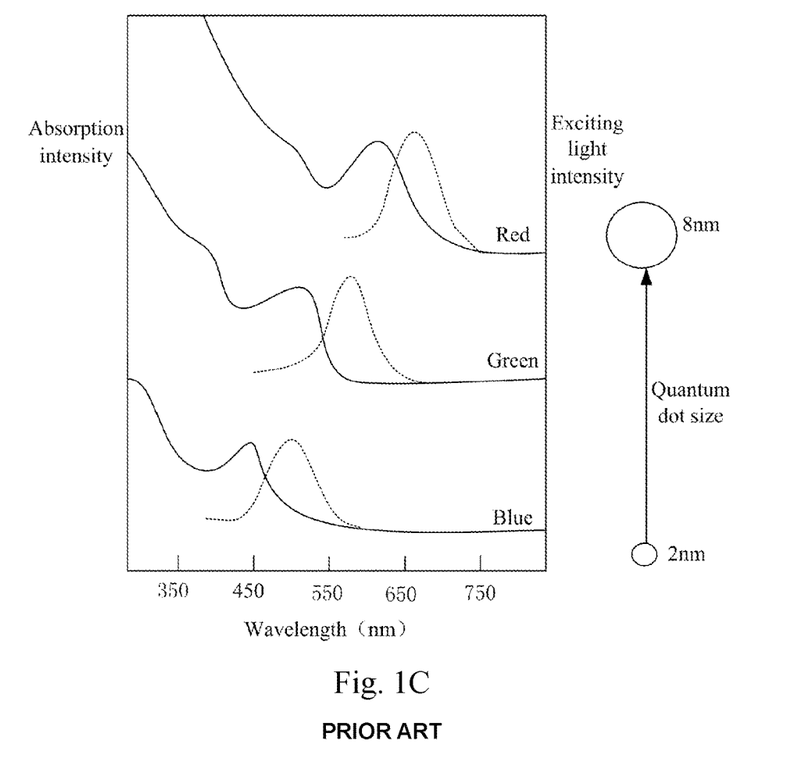
FIG. 1C is a schematic diagram of absorption spectrum and excitation spectrum as a function of quantum dot size.

The inventors have identified at least the following problems during their practices of the relevant art:

As illustrated in FIG. 1A and FIG. 1B, the blue exciting light is generated by the blue LED chip in the relevant art to excite a red quantum dot material in the quantum dot layer to generate red converted light, and to excite a green quantum dot material to generate green converted light, so that the red converted light and the green converted light are mixed with a part of transmitted blue exciting light into white light, where the red quantum dot material and the green quantum dot material are mixed together and packaged in the quantum dot layer. FIG. 1C is a schematic diagram of absorption spectrum and excitation spectrum as a function of quantum dot size, and as illustrated in FIG. 1C, according to the energy conservation law, photons with lower energy are excited by photons with higher energy to generate converted light, where the energy of a photon is E=h*v, where h represents a constant, and v represents the inverse of a wavelength, so that the photon at a shorter wavelength has higher energy, and a stronger exciting capacity, that is, there is a longer wavelength and lower energy of light generated by a quantum dot with a larger size upon being excited, and there is a wider range of wavelengths of a spectrum which can be absorbed.

Figure 2A:
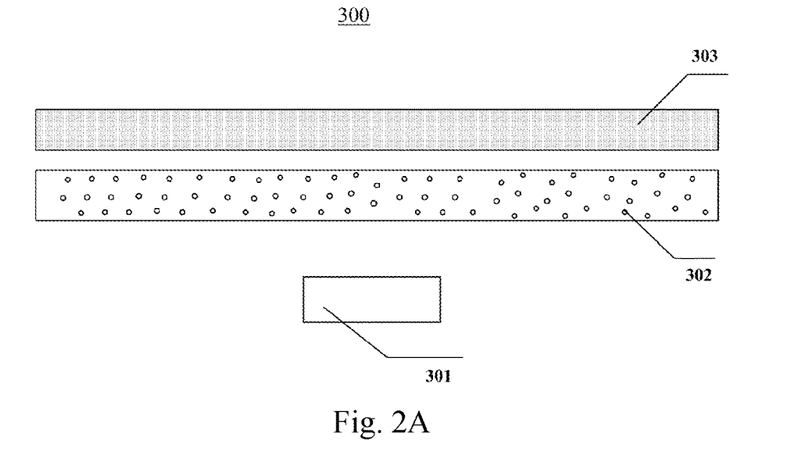
FIG. 2A is a schematic structural diagram of a quantum dot light emitting device according to some embodiments of this disclosure.

In at least one embodiment, as illustrated in FIG. 2A, a quantum dot light emitting device 300 according to this disclosure includes a light emitting device 301, a first quantum dot package layer 302, and a second quantum dot package layer 303, where the light emitting device 301 is configured to generate exciting light at a first wavelength, the first quantum dot package layer 302 is configured to absorb the exciting light at the first wavelength, and to generate converted light at a second wavelength, and the second quantum dot package layer 303 is configured to absorb the exciting light at the first wavelength, and to generate converted light at a third wavelength; and the first quantum dot package layer 302 is located between the light emitting device 301 and the second quantum dot package layer 303, where the third wavelength is shorter than the second wavelength, and longer than the first wavelength.

By way of an example, the light emitting device 301 can be a blue Light Emitting Diode (LED) chip, e.g., a GaN based Light Emitting Diode (LED) chip emitting blue light; or a violet or ultraviolet Light Emitting Diode (LED) chip. A red quantum dot material is packaged in the first quantum dot package layer 302, and the second wavelength is in a red light wave band; and a green quantum dot material is packaged in the second quantum dot package layer 303, and the third wavelength is a in green light wave band.

Figure 2B:
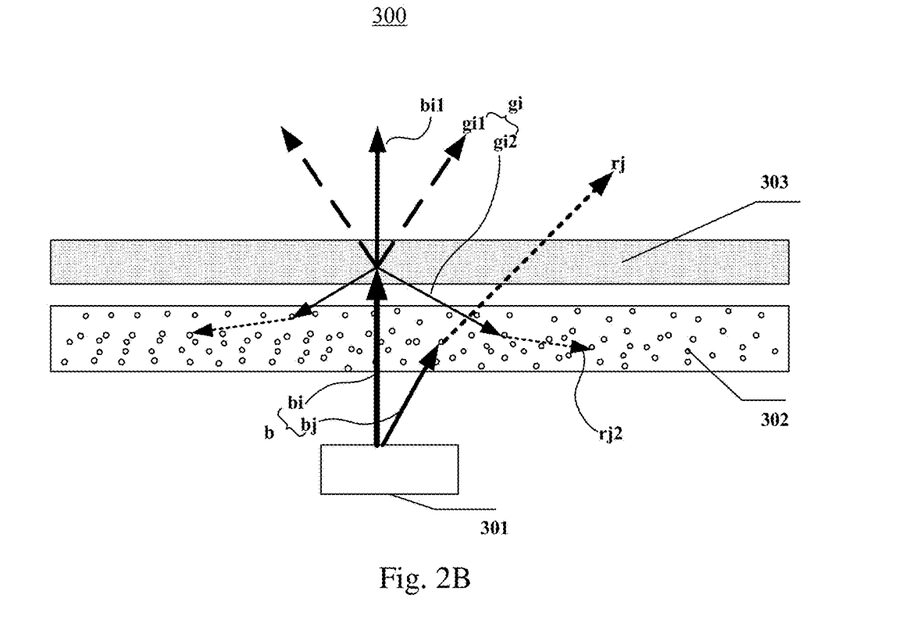
FIG. 2B is a schematic diagram of optical paths in the quantum dot light emitting device in FIG. 2A.

FIG. 2B is a schematic diagram of light paths in the quantum dot light emitting device in FIG. 2A, and as illustrated in FIG. 2B, the light emitting device 301 emits the exciting light at the first wavelength, i.e., blue light b, where a part of the blue light, bj, excites the red quantum dot material in the first quantum dot package layer 302 to generate the red converted light at the second wavelength, rj; and the other part of the blue light, bi, and the red converted light rj travel through the first quantum dot package layer 302 to the second quantum dot package layer 303. Here the red converted light rj will not be absorbed by green quantum dots in the second quantum dot package layer 303, but will be transmitted directly through the second quantum dot package layer 303. A part of the blue light bi transmitted to the second quantum dot package layer 303 excites the green quantum dot material to generate green converted light gi, and the other part thereof bi1 is transmitted directly through the second quantum dot package layer 303, so that the blue light bi1 is mixed with the green converted light gi and the red converted light rj into white light, where the red converted light rj passing the second quantum dot package layer 303 will not be absorbed by the green quantum dot material to generate converted light.

Further referring to FIG. 2B, apparently after the blue light bi excites the second quantum dot package layer 303 to generate the green converted light gi, a part thereof, which is green forward converted light gi1, is transmitted directly through the second quantum dot package layer 303; and since there is no red quantum dot material with a large particle size in a transmission path of the green forward converted light gi1, the green forward converted light gi1 will not be absorbed to be converted again. In the relevant art, since the red quantum dot material and the green quantum dot material are mixed and packaged, the green forward converted light gi1 will inevitably encounter the red quantum dot material with a large particle size, and thus be absorbed to be converted into red light, so in this embodiment, at least the green forward converted light gi1 can be avoided from being absorbed by the red quantum dot material, and thus converted again to thereby improve the conversion efficiency of the blue light.

The inventors have identified from a large number of experiments that approximately 50% of the green converted light gi, i.e., backward converted light gi2, is reflected backward into the first quantum dot package layer 302 to excite again the red quantum dot material to generate red converted light rj2, so although the part of the green converted light, which is the green forward converted light gi1, is avoided from being converted again, the other part thereof, which is the backward converted light gi2, will still be converted gain.

Figure 3A:
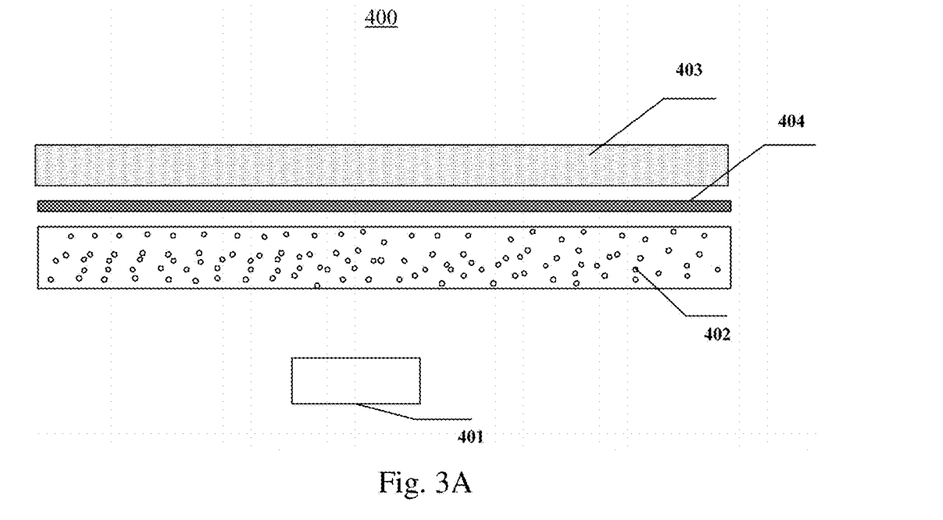
FIG. 3A is a schematic structural diagram of a variant of the quantum dot light emitting device in FIG. 2A.

In order to address a part of the green converted light, which is the backward converted light gi2, from being converted again, FIG. 3A illustrates a schematic structural diagram of a variant of the quantum dot light emitting device in FIG. 2A, and as illustrated in FIG. 3A, unlike the structure illustrated in FIG. 2A, a quantum dot light emitting device 400 further includes a dichroism component 404 arranged between a first quantum dot package layer 402 and a second quantum dot package layer 403 to transmit exciting light at a first wavelength, and converted light at a second wavelength, and to reflect converted light at a third wavelength.

In at least one embodiment, the dichroism component 404 can be structured particularly as a transparent thin film, e.g., a dichroism film, which can be coated on a light exit surface of the first quantum dot package layer 402, or a light incident surface of the second quantum dot package layer 403, here the light exit surface is a surface from which the light exits, for example, the surface of the first quantum dot package layer 402 which facing the second quantum dot package layer 403 is a light exit surface; and the light incident surface is a surface which the light strikes, for example, the surface of the second quantum dot package layer 403 facing the first quantum dot package layer 402 is a light incident surface.

A repeated description of the other components of this variant, which are the same as in the structure illustrated in FIG. 2A will be omitted here.

Figure 3B:
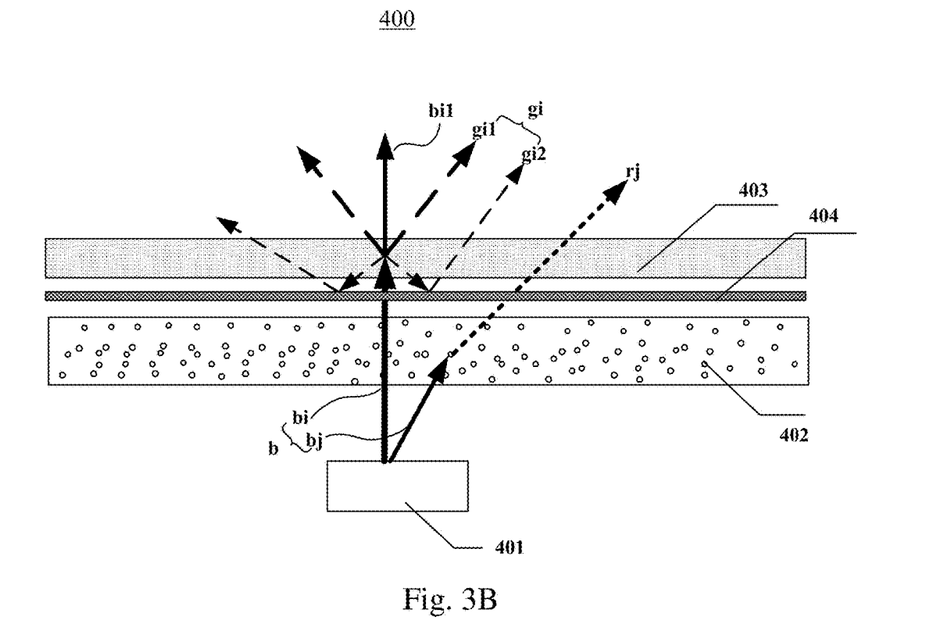
FIG. 3B is a schematic diagram of optical paths in the quantum dot light emitting device in FIG. 3A.

FIG. 3B is a schematic diagram of light paths in the quantum dot light emitting device in FIG. 3A, and as illustrated in FIG. 3B, unlike FIG. 2B, a part of the green converted light gi, which is the backward converted light gi2, is reflected by the dichroism component 404 and then exits the face of the second quantum dot package layer 403 away from the dichroism component 404, where the green backward converted light gi2 is blocked by the dichroism component 404 from being absorbed again by the red quantum dots to thereby further improve the efficiency of converting the blue light.

Figure 3C:
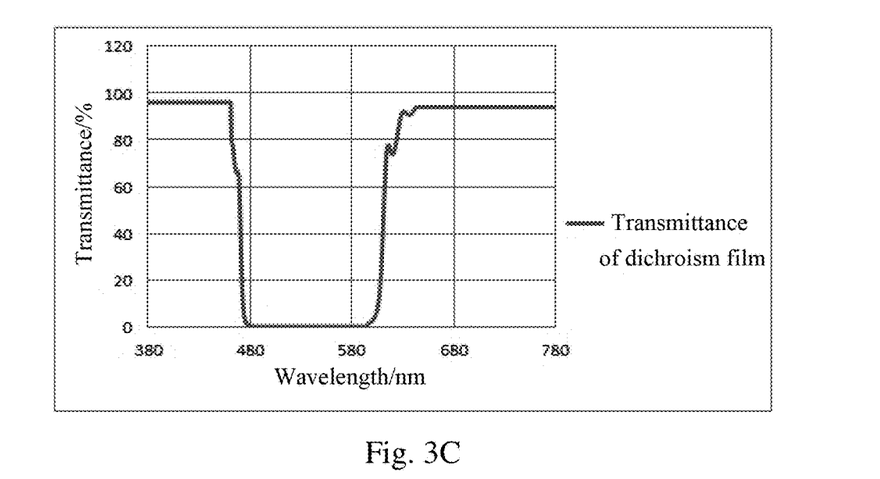
FIG. 3C is a schematic diagram of a transmission characteristic curve of a dichroism film.

FIG. 3C is a schematic diagram of a transmission characteristic curve of the dichroism film, and as illustrated in FIG. 3C, the dichroism film transmits light with wavelengths in other bands than a green light band, and reflects light with wavelengths in the green light band. For example, the transmittance of light with wavelength in the green light band is approximately 0%, and the transmittance of light with wavelengths in the other bands is approximately 100%.

Figure 4A:
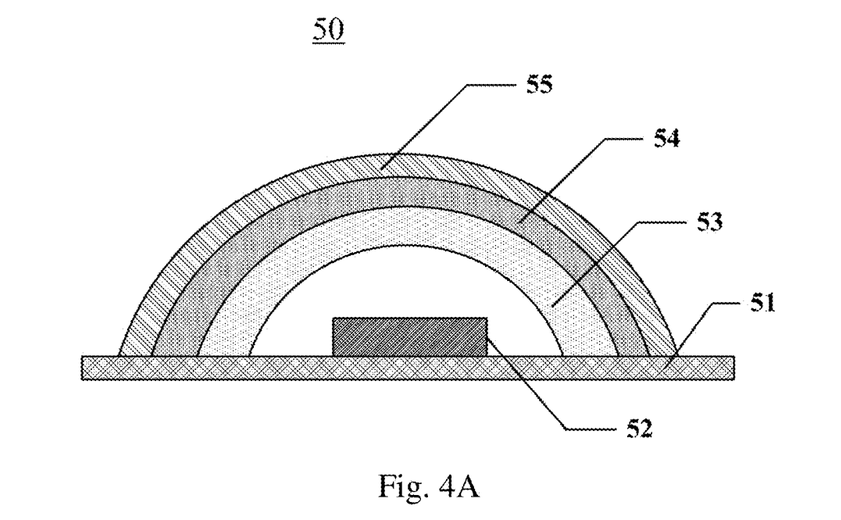
FIG. 4A is a schematic structural diagram of a package according to some embodiments of this disclosure for the quantum dot light emitting device according to the first embodiment.

Some embodiments of this disclosure further provides a quantum dot light emitting device package 50, and as illustrated in FIG. 4A, the quantum dot light emitting device package 50 can be used as a light source, such as a backlight source in a backlight module, or can be used separately as an illuminating light source, and the package includes:

A circuit board 51 arranged as a power circuit of the quantum dot light emitting device package 50;

A light emitting device 52 arranged on the circuit board 51 to generate exciting light at a first wavelength, where the light emitting device 52 can be a Light Emitting Diode (LED) chip, e.g., a GaN based Light Emitting Diode (LED) chip emitting blue light;

A first quantum dot package layer 53 configured to absorb the exciting light at the first wavelength, and to generate converted light at a second wavelength; and A second quantum dot package layer 54 configured to absorb the exciting light at the first wavelength, and to generate converted light at a third wavelength;

Where the first quantum dot package layer 53 and the second quantum dot package layer 54 are connected respectively with the circuit board 51, and formed respectively around the light emitting device 52, where the first quantum dot package layer 53 is formed between the second quantum dot package layer 54 and the light emitting device 52; and the inner and outer surfaces of the first quantum dot package layer 53 and the second quantum dot package layer 54 are formed in arc respectively, where the outer surfaces protruding outward are light exit surfaces, and the inner surfaces protruding inward are light incident surfaces.

In at least one embodiment, silica gel and quantum dot particles can be mixed into the first quantum dot package layer 53 and the second quantum dot package layer 54, where the quantum dots can be semiconductor nanometer crystals with a diameter ranging from 1 nm to 10 nm, which can exhibit a quantum limiting effect, e.g., an Si based nanometer crystal, an II-VI family compound semiconductor nanometer crystal, an III-V family compound semiconductor nanometer crystal, an IV-VI family compound semiconductor nanometer crystal, or other nanometer crystals. It shall be noted that the quantum dots above can be used alone or in combination in the embodiment of this disclosure.

The package 50 further includes a sealing component 55 formed on the outer surface of the second quantum dot package layer 54 to seal the second quantum dot package layer 54. Particularly the sealing component 55 is a water and oxygen barrier layer which can be an $SiO_2$ thin film, an $Si_3N_4$ thin film, or an SiON thin film; and in some embodiments, a thin layer of $Al_2O_3$, $V_2O_5$, etc., fabricated in a physical vapor deposition process or an automatic layer deposition process can also be used as the water and oxygen barrier layer.

In order to prevent the quantum dot material from failing upon being heated, the shortest distance between the opposite surfaces of the first quantum dot package layer 53 and the light emitting device 52 is more than 3 mm. A large number of experiments have shown that if the distance is more than 3 mm, then the average heat of the light emitting device 52 will not cause the quantum dot particles to fail. In some embodiments, the shortest distance between the opposite surfaces of the first quantum dot package layer 53 and the light emitting device 52 is more than 3 mm and less than 10 mm to thereby facilitate a miniaturized design of the quantum dot light emitting device package.

In order to alleviate the quantum dot material from failing upon being heated locally, in some embodiments of this disclosure, there is a diffusing particle layer formed on the side of the first quantum dot package layer 53 proximate to the inner surface of the light emitting device, where the diffusing particle layer includes diffusing particles to diffuse light rays. The exciting light at the first wavelength emitted from the light emitting device 52 is diffused by the scattering particles in the diffusing particle layer, so that the emission angle of the exciting light is widen, thus avoiding the quantum dot material from failing upon being heated locally by the excessively centralized exciting light.

The experiments have shown that if the shortest distance between the surfaces of the light emitting device 52 and the first quantum dot package layer 53 is more than 3 mm, then the average heat of the light emitting device will not cause the quantum dot particles to fail, but if there are excessively centralized light rays emitted by the light source, then the quantum dots will be damaged locally by the excessive local thermal energy, so that the quantum dots may fail locally, so in this embodiment, the diffusing particle layer is arranged on the inner surface side of the first quantum dot package layer 53 to diffuse uniformly the centralized light rays, so that the energy of the light will not be centralized locally to thereby prevent the quantum dots from being damaged, and thus failing, upon being excessively heated locally.

In some embodiments of this disclosure, the scattering particle layer is arranged in addition to the miniaturized design of the quantum dot light emitting device package 50 to thereby avoid the quantum dots from failing at high temperature due to the difficulty to radiate local heat in the miniaturized package.

Figure 4B:
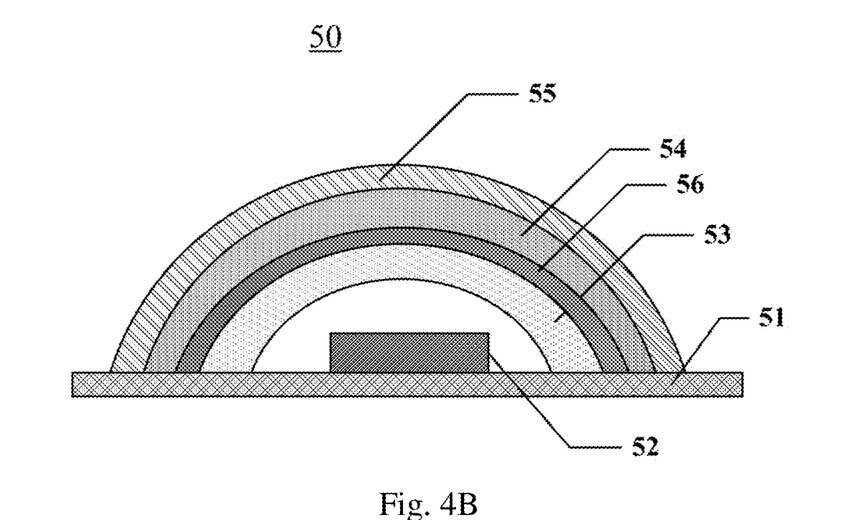
FIG. 4B is a schematic diagram of a variant of the quantum dot light emitting device package in FIG. 4A.

FIG. 4B illustrates a variant of the quantum dot light emitting device package in FIG. 4A, and as illustrated in FIG. 4B, there is a dichroism component 56 arranged between the first quantum dot package layer 53 and the second quantum dot package layer 54, and for details thereof, reference can be made to FIG. 3A and the description related to FIG. 3A, so a repeated description thereof will be omitted here.

Figure 5A:
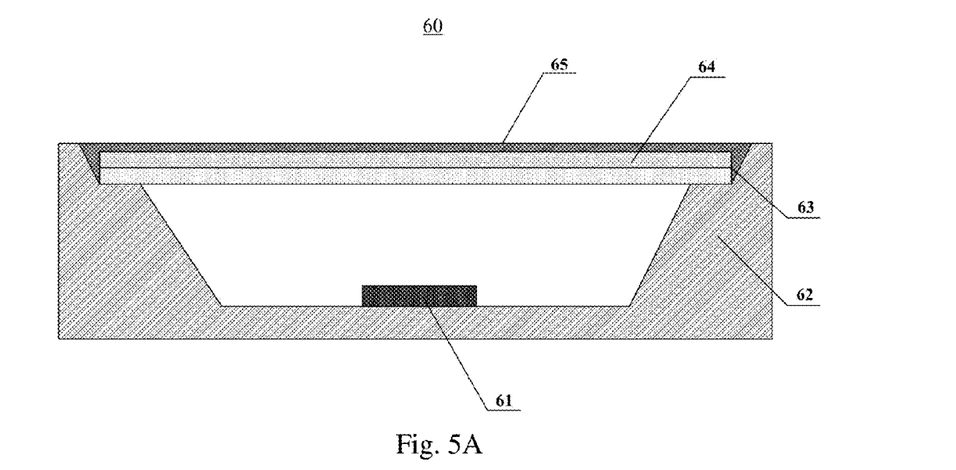
FIG. 5A is a schematic structural diagram of another package of a quantum dot light emitting device according to some embodiments of this disclosure.

Some embodiments of this disclosure further provides a quantum dot light emitting device package 60, and as illustrated in FIG. 5A, the quantum dot light emitting device package 60 can be used as a light source, such as a backlight source in a backlight module, or can be used separately as an illuminating light source.

The quantum dot light emitting device package 60 includes:

A package substrate 62 formed in a groove structure;

A light emitting device 61 arranged on the bottom of the groove and configured to generate exciting light at a first wavelength, where the light emitting device 61 can be a Light Emitting Diode (LED) chip, e.g., a GaN based Light Emitting Diode (LED) chip emitting blue light;

A first quantum dot package layer 63 configured to absorb the exciting light at the first wavelength, and to generate converted light at a second wavelength; and A second quantum dot package layer 64 configured to absorb the exciting light at the first wavelength, and to generate converted light at a third wavelength;

Where the first quantum dot package layer 63 and the second quantum dot package layer 64 are formed respectively at an opening of the concave groove, and the first quantum dot package layer 63 is formed between the second quantum dot package layer 64 and the light emitting device 61. Light exit surfaces of the first quantum dot package layer 63 and the second quantum dot package layer 64 in this embodiment are planar. In another possible embodiment, the surfaces of the first quantum dot package layer 63 and the second quantum dot package layer 64 can be arc faces.

In at least one embodiment, silica gel and quantum dot particles can be mixed into the first quantum dot package layer 63 and the second quantum dot package layer 64, where the quantum dots can be semiconductor nanometer crystals with a diameter ranging from 1 nm to 10 nm, which can exhibit a quantum confinement effect, e.g., an Si based nanometer crystal, an II-VI family compound semiconductor nanometer crystal, an III-V family compound semiconductor nanometer crystal, an IV-VI family compound semiconductor nanometer crystal, or other nanometer crystals. It shall be noted that the quantum dots above can be used alone or in combination in the embodiment of this disclosure.

There is a sealing component 65 formed on the outer surface of the second quantum dot package layer 64 to seal the second quantum dot package layer 64. Particularly the sealing component 65 is a water and oxygen barrier layer which can be an $SiO_2$ thin film, an $Si_3N_4$ thin film, or an SiON thin film; and in some embodiments, a thin layer of $Al_2O_3$, $V_2O_5$, etc., fabricated in a physical vapor deposition process or an automatic layer deposition process can also be used as the water and oxygen barrier layer.

In order to prevent the quantum dot material from failing upon being heated, the shortest distance between the opposite surfaces of the first quantum dot package layer 63 and the light emitting device 61 is more than 3 mm. In some embodiments, the shortest distance between the opposite surfaces of the first quantum dot package layer 63 and the light emitting device 61 is more than 3 mm and less than 10 mm. In the meanwhile, in order to further alleviate the quantum dot material from failing upon being heated locally, and from a color cast at the middle thereof arising from strong blue light, there is a diffusing particle layer formed on the inner surface side of the first quantum dot package layer 63, where the diffusing particle layer includes diffusing particles to diffuse light rays. The exciting light at the first wavelength emitted from the light emitting device 61 is diffused by the scattering particles in the diffusing particle layer, so that the emission angle of the exciting light is widen, and the exciting light is made more uniform, thus avoiding the quantum dot material from failing upon being heated locally by the excessively centralized exciting light, and the light from being non-uniform in color as a whole due to the blue light with excessively centralized strength.

Figure 5B:
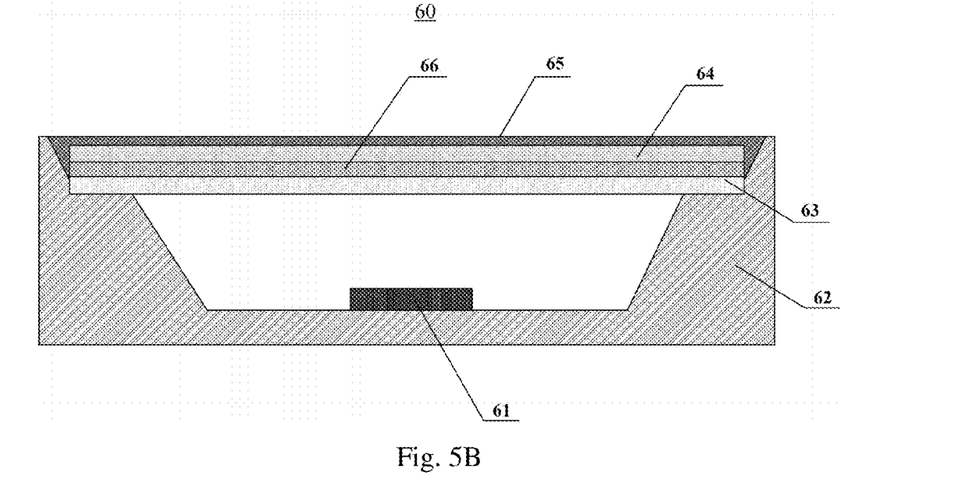
FIG. 5B is a schematic diagram of a variant of the quantum dot light emitting device package in FIG. 5A.

FIG. 5B illustrates a variant of the quantum dot light emitting device package in FIG. 5A, and as illustrated in FIG. 5B, there is a dichroism component arranged between the first quantum dot package layer 63 and the second quantum dot package layer 64, and for details thereof, reference can be made to the description above of the dichroism component, so a repeated description thereof will be omitted here.

Some embodiments of this disclosure further provides a backlight module including:

Any one of the quantum dot light emitting devices illustrated in FIG. 3A and FIG. 3B, which is used as a backlight source of a backlight module, and which can be implemented by those skilled in the art referring to the structure of a backlight module in the relevant art.

Figure 6:
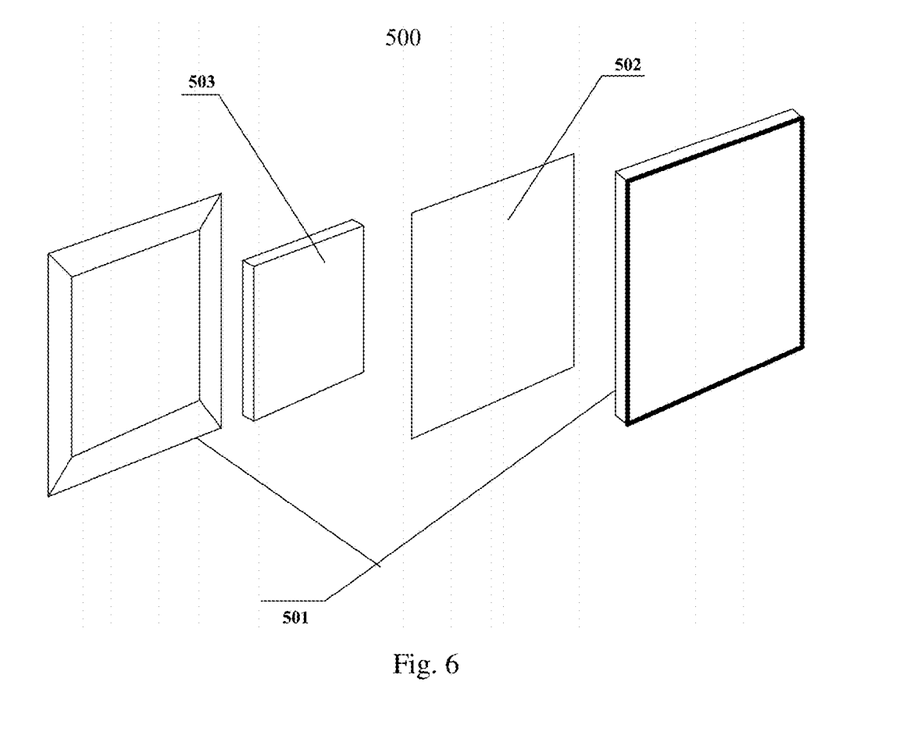
FIG. 6 is a schematic structural diagram of a liquid crystal display device according to some embodiments of this disclosure.

Some embodiments of this discourse further provides a liquid crystal display device, and as illustrated in FIG. 6, the quantum dot light emitting device 500 includes:

A housing 501, a liquid crystal display panel 502, and a backlight module 503, where the backlight module 503 can be the backlight module above, so a repeated description thereof will be omitted here, where the housing 501 can include a front housing and a back housing.

In some other possible embodiments, the housing 501 can be dispensed, but the appearance function of the housing 501 can be integrated on the backlight module 503.

In a practical application, the liquid crystal display panel can be a thin film transistor Liquid Crystal Display (LCD) device.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A quantum dot light emitting device comprising:
   a light emitting device configured to generate exciting light at a first wavelength;
   a first quantum dot package layer configured to absorb the exciting light at the first wavelength, and generate converted light at a second wavelength;
   a second quantum dot package layer configured to absorb the exciting light at the first wavelength, and generate converted light at a third wavelength; and
   a dichroism component arranged between the first quantum dot package layer and the second quantum dot package, the dichroism component configured to transmit the light at the first wavelength and the light at the second wavelength, and reflect the light at the third wavelength;
wherein the first quantum dot package layer is arranged between the light emitting device and the second quantum dot package layer, and wherein the third wavelength is shorter than the second wavelength, and longer than the first wavelength.

2. A quantum dot light emitting device comprising:
a light emitting device configured to generate exciting light at a first wavelength;
a first quantum dot package layer configured to absorb the exciting light at the first wavelength, and generate converted light at a second wavelength;
a second quantum dot package layer configured to absorb the exciting light at the first wavelength, and generate converted light at a third wavelength;
wherein the first quantum dot package layer is arranged between the light emitting device and the second quantum dot package layer, wherein the third wavelength is shorter than the second wavelength, and longer than the first wavelength, and wherein a shortest distance between opposite surfaces of the first quantum dot package layer and the light emitting device is more than 3 mm.

3. The quantum dot light emitting device according to claim 2, wherein inner and outer surfaces of the first quantum dot package layer and the second quantum dot package layer are arc-shaped, wherein the outer surfaces protruding outward are light exit surfaces, and wherein the inner surfaces protruding inward are light incident surfaces.

4. The quantum dot light emitting device according to claim 3, further comprising a circuit board on which the light emitting device is arranged, wherein the first quantum dot package layer and the second quantum dot package layer are connected with the circuit board, and disposed around the light emitting device.

5. The quantum dot light emitting device according to claim 2, further comprising a package substrate disposed in a groove structure, wherein the light emitting device is arranged on a bottom of the package substrate in the groove structure, and wherein the first quantum dot package layer and the second quantum dot package layer are disposed at an opening of the groove.

6. The quantum dot light emitting device according to claim 5, wherein light exit surfaces of the first quantum dot package layer and the second quantum dot package layer are planar.

7. The quantum dot light emitting device according to claim 2, further comprising a sealing component disposed formed on an outer surface of the second quantum dot package layer and configured to seal the second quantum dot package layer.

8. The quantum dot light emitting device according to claim 2, wherein the converted light at the second wavelength is allowed to transmit through the second quantum dot package layer without exciting the second quantum dot package layer.

9. A liquid crystal display device comprising:
a backlight module; and
a liquid crystal display panel arranged above the backlight module;
wherein the backlight module comprises a quantum dot light emitting device, wherein the quantum dot light emitting device comprises a light emitting device configured to generate exciting light at a first wavelength, a first quantum dot package layer configured to absorb the exciting light at the first wavelength, and generate converted light at a second wavelength, a second quantum dot package layer configured to absorb the exciting light at the first wavelength, and generate converted light at a third wavelength, and a dichroism component configured to transmit the light at the first wavelength and the light at the second wavelength, and reflect the light at the third wavelength, wherein the dichroism component is arranged between the first quantum dot package layer and the second quantum dot package layer, wherein the first quantum dot package layer is arranged between the light emitting device and the second quantum dot package layer, and wherein the third wavelength is shorter than the second wavelength, and longer than the first wavelength.

10. A liquid crystal display device comprising:
a backlight module; and
a liquid crystal display panel arranged above the backlight module;
wherein the backlight module comprises a quantum dot light emitting device, wherein the quantum dot light emitting device comprises a light emitting device configured to generate exciting light at a first wavelength, a first quantum dot package layer configured to absorb the exciting light at the first wavelength, and generate converted light at a second wavelength, and a second quantum dot package layer configured to absorb the exciting light at the first wavelength, and generate converted light at a third wavelength, wherein the first quantum dot package layer is arranged between the light emitting device and the second quantum dot package layer, wherein the third wavelength is shorter than the second wavelength, and longer than the first wavelength, and wherein a shortest distance between opposite surfaces of the first quantum dot package layer and the light emitting device is more than 3 mm.

11. The liquid crystal display device according to claim 10, wherein inner and outer surfaces of the first quantum dot package layer and the second quantum dot package layer are arc-shaped, wherein the outer surfaces protruding outward are light exit surfaces, and wherein the inner surfaces protruding inward are light incident surfaces.

12. The liquid crystal display device according to claim 11, wherein the quantum dot light emitting device further comprises a circuit board on which the light emitting device is arranged, and wherein the first quantum dot package layer and the second quantum dot package layer are connected with the circuit board, and disposed around the light emitting device.

13. The liquid crystal display device according to claim 10, wherein the quantum dot light emitting device further comprises a dichroism component arranged between the first quantum dot package layer and the second quantum dot package layer, and wherein the dichroism component is configured to transmit the light at the first wavelength and the light at the second wavelength, and reflect the light at the third wavelength.

14. The liquid crystal display device according to claim 10, wherein the quantum dot light emitting device further comprises a diffusing particle layer disposed on a side of the first quantum dot package layer proximate to the light emitting device.

15. A quantum dot light emitting device comprising:
a light emitting device configured to generate exciting light at a first wavelength;

a first quantum dot package layer configured to absorb the exciting light at the first wavelength, and generate converted light at a second wavelength;

a second quantum dot package layer configured to absorb the exciting light at the first wavelength, and generate converted light at a third wavelength; and a diffusing particle layer disposed on a side of the first quantum dot package layer proximate to the light emitting device;

wherein the first quantum dot package layer is arranged between the light emitting device and the second quantum dot package layer, and wherein the third wavelength is shorter than the second wavelength, and longer than the first wavelength.

16. A liquid crystal display device comprising:

a backlight module; and a liquid crystal display panel arranged above the backlight module;

wherein the backlight module comprises a quantum dot light emitting device, wherein the quantum dot light emitting device comprises a light emitting device configured to generate exciting light at a first wavelength, a first quantum dot package layer configured to absorb the exciting light at the first wavelength, and generate converted light at a second wavelength, a second quantum dot package layer configured to absorb the exciting light at the first wavelength, and generate converted light at a third wavelength, and a diffusing particle layer disposed on a side of the first quantum dot package layer proximate to the light emitting device, wherein the first quantum dot package layer is arranged between the light emitting device and the second quantum dot package layer, and wherein the third wavelength is shorter than the second wavelength, and longer than the first wavelength.

* * * * *